(12) United States Patent
Fang et al.

(10) Patent No.: US 7,208,403 B2
(45) Date of Patent: Apr. 24, 2007

(54) TILE-BASED ROUTING METHOD OF A MULTI-LAYER CIRCUIT BOARD AND RELATED STRUCTURE

(75) Inventors: Chung-Yi Fang, Hsin-Chu (TW); Tze-Hsiang Chao, Hsin-Chu (TW); Yi-Show Su, Tainan Hsien (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 11/277,042

(22) Filed: Mar. 21, 2006

(65) Prior Publication Data

US 2006/0154402 A1 Jul. 13, 2006

Related U.S. Application Data

(62) Division of application No. 10/604,036, filed on Jun. 23, 2003, now Pat. No. 7,043,828.

(51) Int. Cl.
  *H01L 21/44* (2006.01)
(52) U.S. Cl. .................. 438/612; 257/E23.062
(58) Field of Classification Search ............... 438/478, 438/184, 193, 195–198, 200–207, 209–211, 438/218, 237, 165, 248, 168, 343, 294, 308, 438/6, 10, 107–114, 104, 118, 121–123, 128–129, 438/135, 142, 145, 149, 151, 157, 176
See application file for complete search history.

(56) References Cited

U.S. PATENT DOCUMENTS 6,225,143 B1  5/2001 Rao et al.
6,674,166 B2  1/2004 Rao et al.
6,680,544 B2  1/2004 Lu et al.
6,765,287 B1* 7/2004 Lin ........................... 257/686
7,034,391 B2* 4/2006 Pendse ....................... 257/691
2003/0003705 A1* 1/2003 Chung et al. ............... 438/612
2004/0183213 A1* 9/2004 Hsu et al. ................... 257/786
2004/0255457 A1  12/2004 Fang et al.
2005/0277283 A1* 12/2005 Lin et al. .................... 438/618

* cited by examiner

*Primary Examiner*—Michael Lebentritt
*Assistant Examiner*—Andre' Stevenson
(74) *Attorney, Agent, or Firm*—Winston Hsu

(57) ABSTRACT

A method for routing a plurality of signal traces out of a plurality of corresponding bumper pads for implementation of a die on a multi-layer circuit board includes utilizing the plurality of bumper pads positioned in a periphery area of the die; utilizing a plurality of power/ground bumper pads positioned in a center area of the die; assigning a plurality of signal traces corresponding to a plurality of bumper pads as a plurality of first-layer traces being routed in a first layer of the multi-layer circuit board; assigning a plurality of signal traces corresponding to a plurality of bumper pads as a plurality of second-layer traces being routed in a second layer of the multi-layer circuit board; routing the plurality of first-layer traces straight away from the die; and routing the plurality of second-layer traces with a turn not to be vertically underneath the first-layer traces.

16 Claims, 13 Drawing Sheets

US 7,208,403 B2

TILE-BASED ROUTING METHOD OF A MULTI-LAYER CIRCUIT BOARD AND RELATED STRUCTURE

CROSS REFERENCE TO RELATED APPLICATIONS

This application is a division of U.S. application Ser. No. 10/604,036 filed Jun. 23, 2003 now U.S. Pat. No. 7,043,828, the contents of which are herein incorporated by reference in their entirety.

BACKGROUND OF THE INVENTION

1. Field of the Invention

The present invention relates to a routing method for routing a plurality of signal traces out of corresponding bumper pads in a multi-layer circuit board, and more particularly, to a tile-based routing method for routing a plurality of signal traces and a plurality of shielding traces in the multi-layer circuit board.

2. Description of the Prior Art

In modern society with developed computer technology, the computer system, which comprises a plurality of integrated circuits, has been utilized in a broad spectrum of fields. For example, household appliances with automatic control systems, mobile communication devices, and personal computers utilize integrated circuits to perform certain functions. The main body of the IC is a die manufactured by a prior-art semiconductor process. The manufacturing process of the die starts from forming a wafer. Each wafer is divided into a plurality of regions. On each region, many circuits are formed through the prior art semiconductor process. In the end, each processed region on the wafer is sliced to generate a plurality of dies. After the required die is obtained, it requires a specific way to electrically connect the processed die with a circuit board such as a printed circuit board (PCB). Therefore, the die is capable of acquiring its operating voltage from the PCB for performing a predetermined operation. For instance, suppose that the IC die corresponds to an encoder circuit. After the encoder circuit is provided with an appropriate operating voltage, the IC die (encoder circuit) is capable of encoding data inputted from the circuit board, and then returns the encoded data to the circuit board.

Certain IC dies, called wire-bond IC dies, are fabricated with metal bonding pads only along their periphery. These peripheral pads serve as terminals for connecting the die to external signals, including control signals, power and ground. Typically, the wire-bond IC die is mounted within a plastic or ceramic package having multiple pins, and wire connections are made between the die's bonding pads and the package's pins. However, the above-mentioned packaging method has its limitations. First, because only the periphery of the die is used for external connection pads, the number of such pads for a given sized die is limited. In particular, advances in technology which permit more and more gates to be placed within a given die area have resulted in an increased demand for such pads, particularly power and ground pads. In certain cases, the design requires more pads than can be provided solely at the die's periphery. Second, when all the pads are provided only at the die's periphery, additional routing is required to bring the corresponding signals, particularly power and ground signals, to the interior logic of the die. Third, in wire-bond dies, the wire connections between the die and the package pins introduce additional resistance and inductance, which sometimes may spoil the die's performance.

The flip-chip packaging, which is developed to overcome the above-mentioned problems, has become a more preferable packaging method nowadays. The flip-chip packaging technology allows the overall package size to be made significantly compact. The connections between the IC die and the exterior electrical components offer a lower inductance and resistance electrical connection than wire-bond packaging. In addition, the shorter connection path of power and ground improves the power supplement quality. However, even based on the flip-chip packaging technique, a basic and inevitable principle is that the die size should be subject to the size and quantity of the spreading bumpers. Due to that nowadays, companies developing and manufacturing electronic products are challenged by a blooming market demand for smaller, more efficient, and a higher performance product, bringing down the relative die size to meet the cost concern becomes a crucial issue.

For achieving the space-saving advantage, a multi-layer substrate (circuit board) should also be included in an electrical system. The current fabrication process of the multi-layer substrate could be sorted into different methods, including a laminated substrate, and a build-up substrate. The build-up substrate among them would be the most suitable one for a high pin-count application to extend the density capability of the conventional circuit board due to its thin signal trace (30 μm). Please refer to both FIG. 1 and FIG. 2. FIG. 1 is a schematic diagram showing a typical arrangement of a die 10 located on a 6-layer build-up substrate 12, and FIG. 2 is a schematic diagram of an embodiment of the 6-layer build-up substrate 12 shown in FIG. 1. The 6-layer build-up substrate 12 includes 4 build-up layers (layers 12A, 12B, 12E, and 12F) for routing a plurality of signal traces. Each build-up layer provides a 25/25 μm trace width/space, and an 110 μm via 12G. The other two traditional layers C, D respectively provides a 100/100 μm trace width/space and a 440 μm via 12H. Due to the structure of the 6-layer build-up substrate 12, when the 6-layer build-up substrate 12 is actually implemented, only the 4 build-up layers (layers 12A, 12B, 12E, and 12F) would be used for signal-trace routing functions. The remaining layers (two traditional layers 12C, 12D) can be used to provide power and ground spreading due to that the wide via (440 μm) 12H between the layer 12C and the layer 12D is unfavorable for many signal traces to pass through. Please refer to FIG. 3, which is a detailed schematic diagram describing the region 14 shown in FIG. 1. The embodiment in FIG. 3 shows a plurality of signal traces 18 spread from the die 10 and routed in the 6-layer build-up substrate 12 shown in FIG. 2. The embodiment in FIG. 3 shows that all the signal traces 18 are designed to be routed in the build-up layers 12A, 12B. Therefore, all the signal traces 18 can be classified into first-layer traces 18(1) and second-layer traces 18(2), respectively representing the signal traces 18 routed in the build-up layers 12A and in the build-up layers 12B. Please also refer to FIG. 4, which is a schematic diagram illustrating a plurality of bumper pads 20 arranged over the die 10 as shown in FIG. 1 and FIG. 3. The plurality of bumper pads 20 will be used as the input/output terminals for the die 10. The signal traces 18 as shown in FIG. 1 or FIG. 3 can be routed out of a plurality of corresponding bumper pads 20 located on either a periphery area of the die 10, called die periphery 22, or a center area 24 of the die 10.

Please return to refer to FIG. 1 and FIG. 2. When those signal traces 18 start to fan out from the bumper pads 20 of the die 10, the assumed area 16 is not so wide to accommodate so huge wide vias 12H. Therefore, there would be very few signal traces 18 being routed down to the build-up layers 12E, 12F. That also explains why the signal traces 18 are almost routed in the build-up layers 12A, 12B (top 2 layers) as shown in FIG. 3. As you can see in the FIG. 4, when using flip-chip techniques, a typical IC die 10 often will contain hundreds of bumper pads 20. Routing the signal traces 18 from each of these bumper pads 20 to the appropriate position on the die 10 can therefore become a complicated task. In addition, these large amounts of bumper pads 20 have to be assigned closer to get a more effective use of the routing space on the substrate 12. In the meanwhile, the (6-layer) build-up substrate 12 is required to provide a more aggressive signal routing density within a certain area and higher flexibility of fanning out the signal traces 18. However, the higher signal trace density and lower die size will also introduce the smaller space among all the signal traces 18, which would worsen the cross-talk effect (mostly the capacitive cross-talk) between signals and bring down the signal quality.

SUMMARY OF THE INVENTION

It is therefore a primary objective of the claimed invention to provide a tile-based routing method for routing a plurality of signal traces and a plurality of shielding traces in the multi-layer circuit board to solve the above-mentioned problems.

According to the claimed invention, a method for routing a plurality of signal traces out of a plurality of corresponding bumper pads for implementation of a die on a multi-layer circuit board is disclosed. The method comprises utilizing the plurality of bumper pads positioned in a periphery area of the die; utilizing a plurality of power/ground bumper pads positioned in a center area of the die; arranging the plurality of bumper pads in a specific forming process; assigning a plurality of signal traces corresponding to a plurality of bumper pads as a plurality of first-layer traces being routed in a first layer of the multi-layer circuit board; assigning a plurality of signal traces corresponding to a plurality of bumper pads as a plurality of second-layer traces being routed in a second layer of the multi-layer circuit board wherein the second layer is vertically beneath the first layer; routing the plurality of first-layer traces straight away from the die; routing the plurality of second-layer traces with a turn not to be vertically underneath the first-layer traces; and shielding the plurality of first-layer traces and the plurality of second-layer traces by routing a plurality of shielding traces out of the plurality of power/ground bumper pads.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
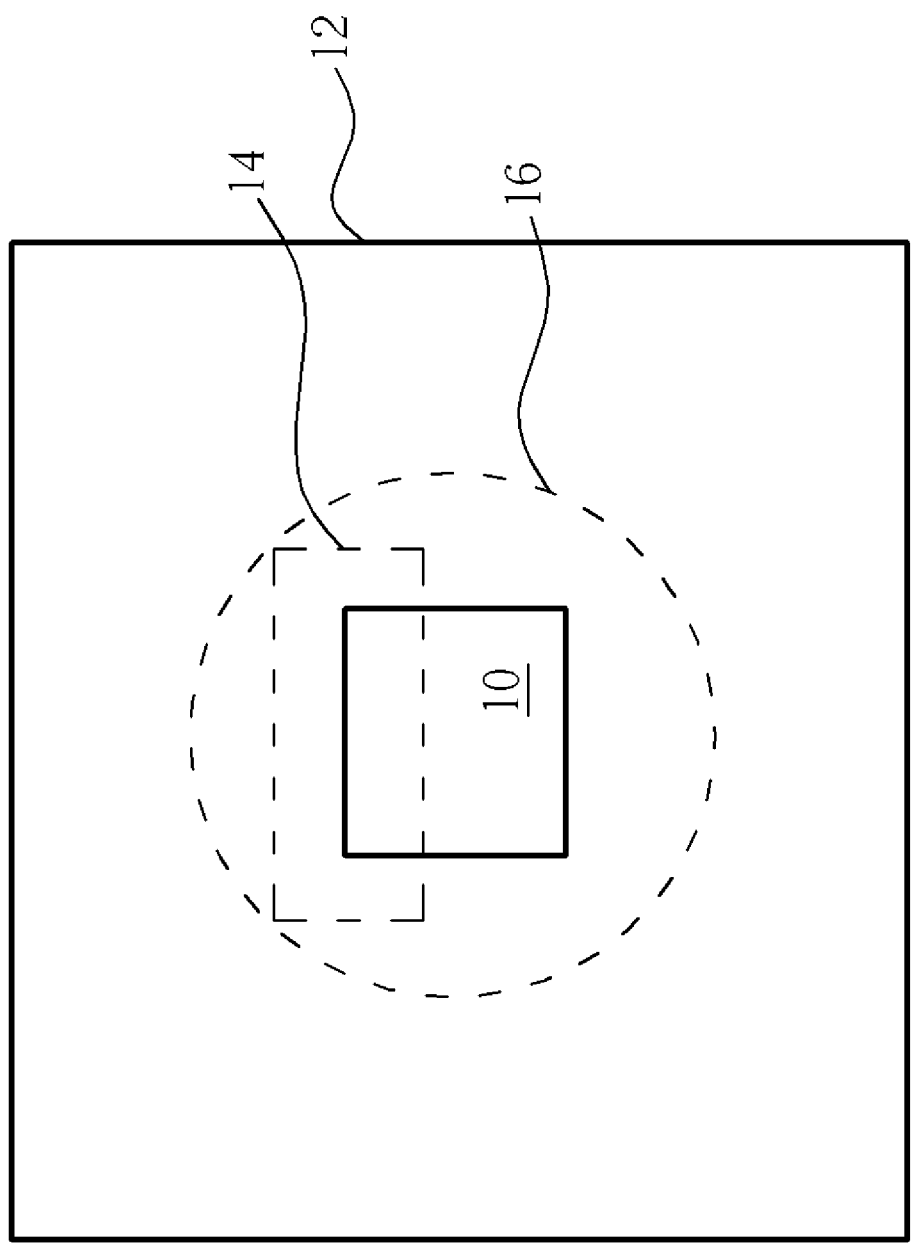
FIG. 1 is a schematic diagram showing a typical arrangement of a die located on a 6-layer build-up substrate
Figure 4:
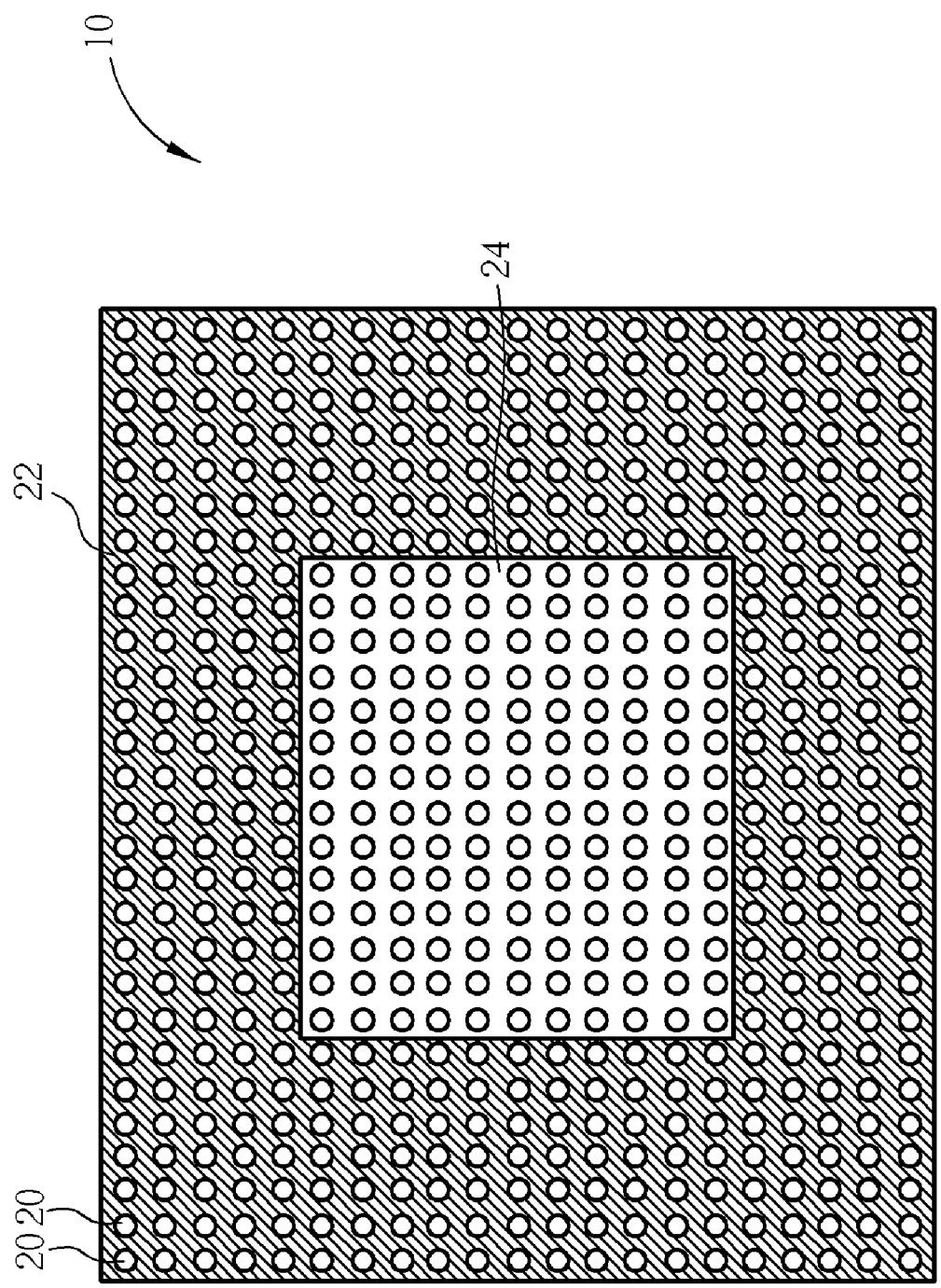
FIG. 4 is a schematic diagram illustrating a plurality of bumper pads arranged over the die as shown in FIG. 1 and FIG. 3.
Figure 5:
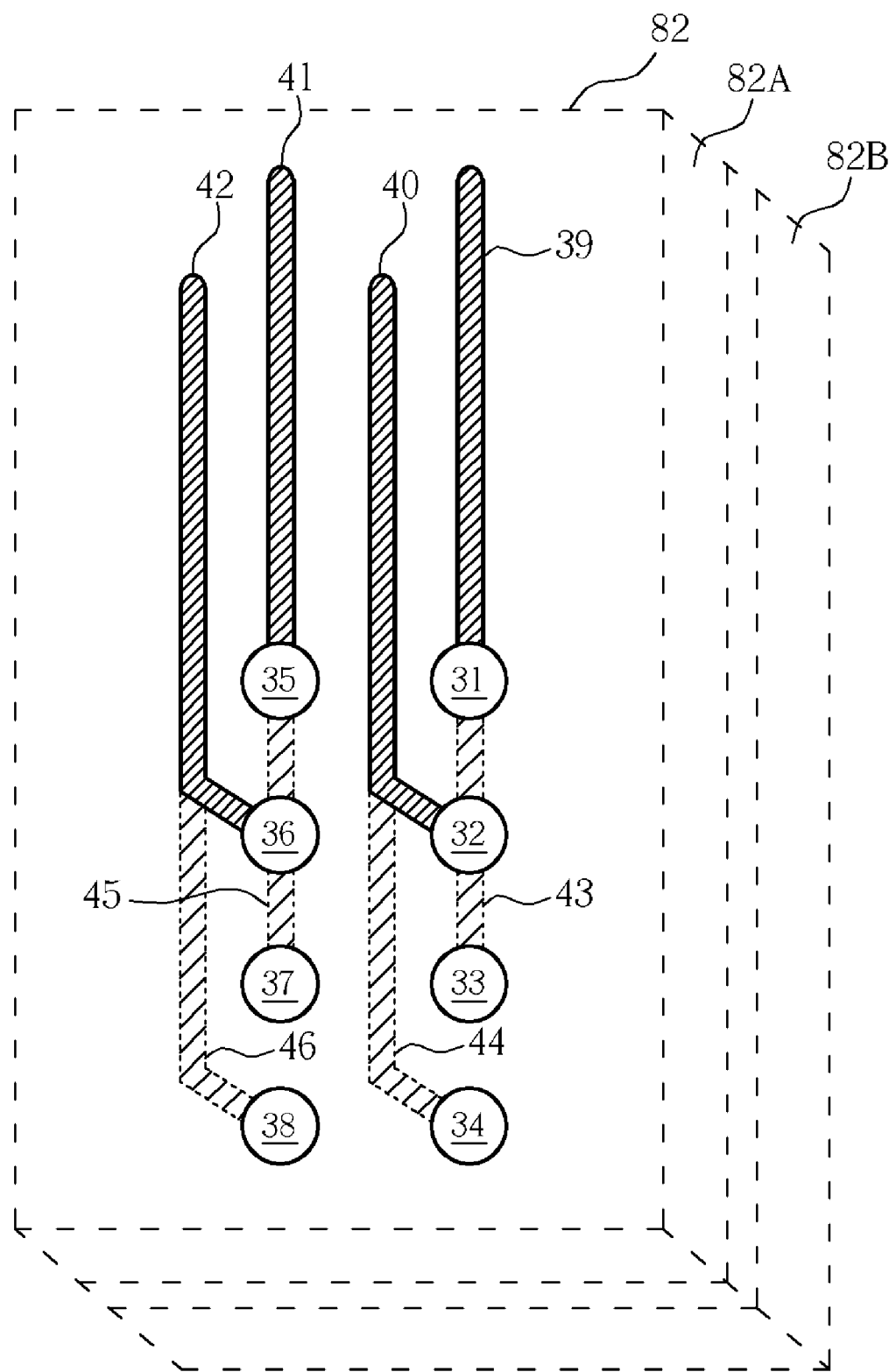
FIG. 5 is a schematic diagram showing a first arrangement of a plurality of bumper pads and a plurality of corresponding signal traces.

Please refer to FIG. 5, which is a schematic diagram showing a first arrangement of partial bumper pads 31-38 and a plurality of corresponding signal traces 39–46. The arrangement of the bumper pads is highly relevant to a die size of a high pin count chip. With the flip chip packaging, the die size (the embodiment of die 10 is shown in FIG. 1 and FIG. 4) is subject to 2 items, quantity of the bumper pads and a required area in which the plurality of corresponding signal traces are routed. As shown in FIG. 5, the bumper pads 31–38 are assigned on a multi-layer substrate 82. The multi-layer substrate 82 comprises at least a first layer 82A and a second layer 82B (the second layer 82B is vertically underneath the first layer 82A). The multi-layer substrate 82 can be the 6-layer build-up substrate 12 described in FIG. 2 (the first layer 82A corresponds to the build-up layer 12A, and the second layer 82B corresponds to the build-up layer 12B) or any other multi-layer circuit board. The distance between each bumper pad, named bumper pitch, is minimum distance, 227 μm, under the current fabrication process. The width of each bumper pad is 110 μm under the current fabrication process. A plurality of signal traces 39–42 are respectively routed out of the bumper pads 31, 32, 35 and 36 in the first layer 82A of the multi-layer substrate 82. The minimum width of the signal trace is 25 μm and the minimum space between adjacent signal traces is also 25 μm. After easy calculation, the space between the bumper pad 31 and the bumper pad 35 is 112 μm (227−115=112), which only allows one signal trace to pass through. Therefore, the signal traces 43–46 corresponding to the bumper pads 33, 34, 37 and 39 could only be assigned to occupy the second layer 82B, and those signal traces 43–46 in the second layer 82B are drawn in dotted lines. Please notice that the bumper pad 31 or 35 cannot be assigned as a power or ground pad. If the bumper pads 31 and 35 are occupied by power or ground functions, the two corresponding signal traces would be lost. Thus, more bumper pads are required, and a larger die periphery (as the die periphery 22 shown in FIG. 4) is required to fit these bumper pads in. Therefore, the above-mentioned method is not a cost saving way. Due to the above-mentioned problem, an effective arrangement of bumper pads favorable for die size minimization can refer to FIG. 4, which is a schematic diagram illustrating a plurality of bumper pads 20 arranged over a die 10 as shown in FIG. 1. The die periphery 22 contains the bumper pads corresponding to all input/output signal traces of the die 10. That is, all signal traces related to the input/output signal applications are assigned to occupy all the peripheral area of the die 10, the die periphery 22. The center area 24 of the die 10 belongs to the power/ground bumper-pad occupation.

Figure 2:
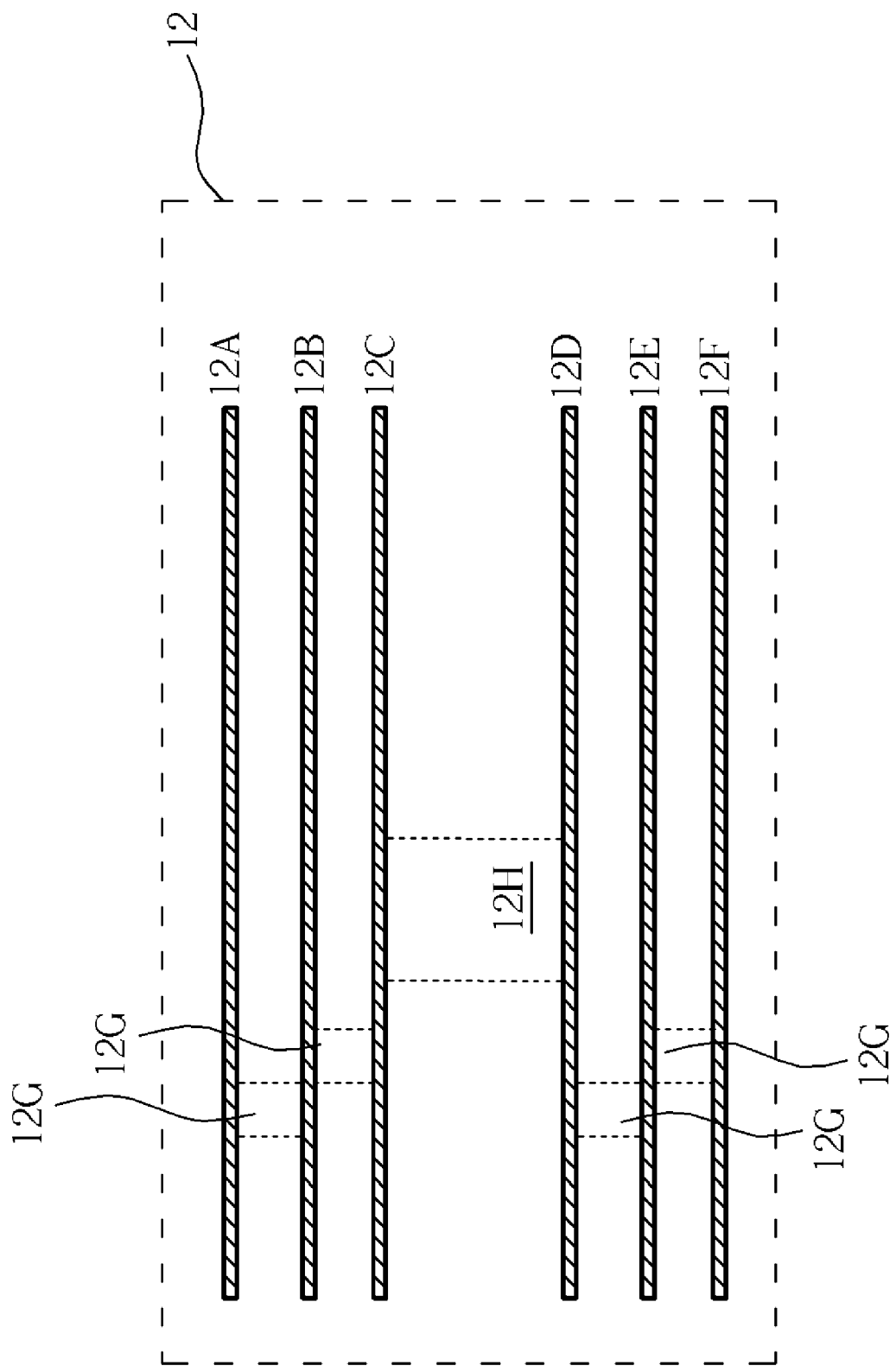
FIG. 2 is a schematic diagram of an embodiment of the 6-layer build-up substrate shown in FIG. 1.
Figure 3:
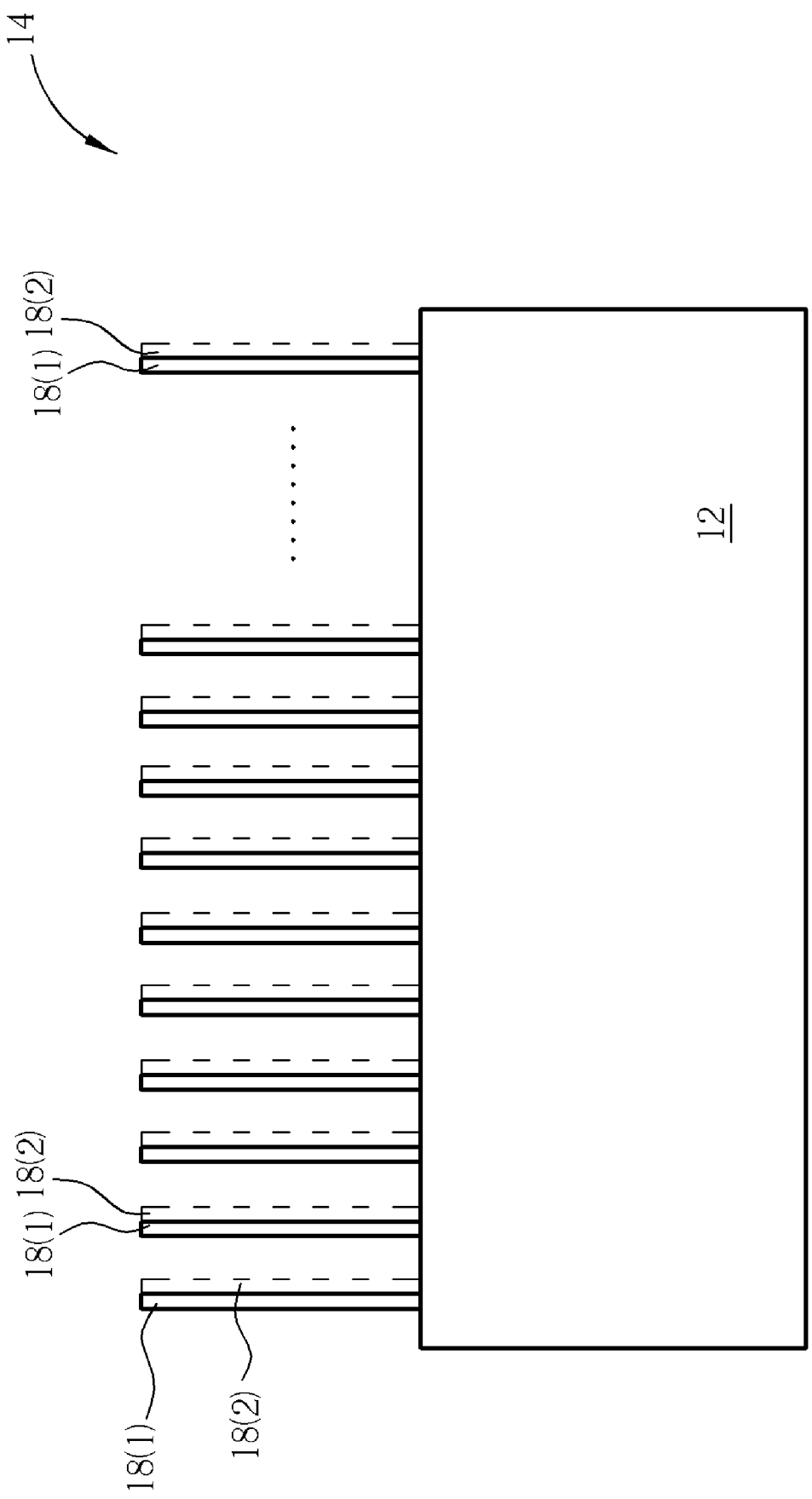
FIG. 3 is a detailed schematic diagram describing the region 14 shown in FIG. 1.
Figure 6:
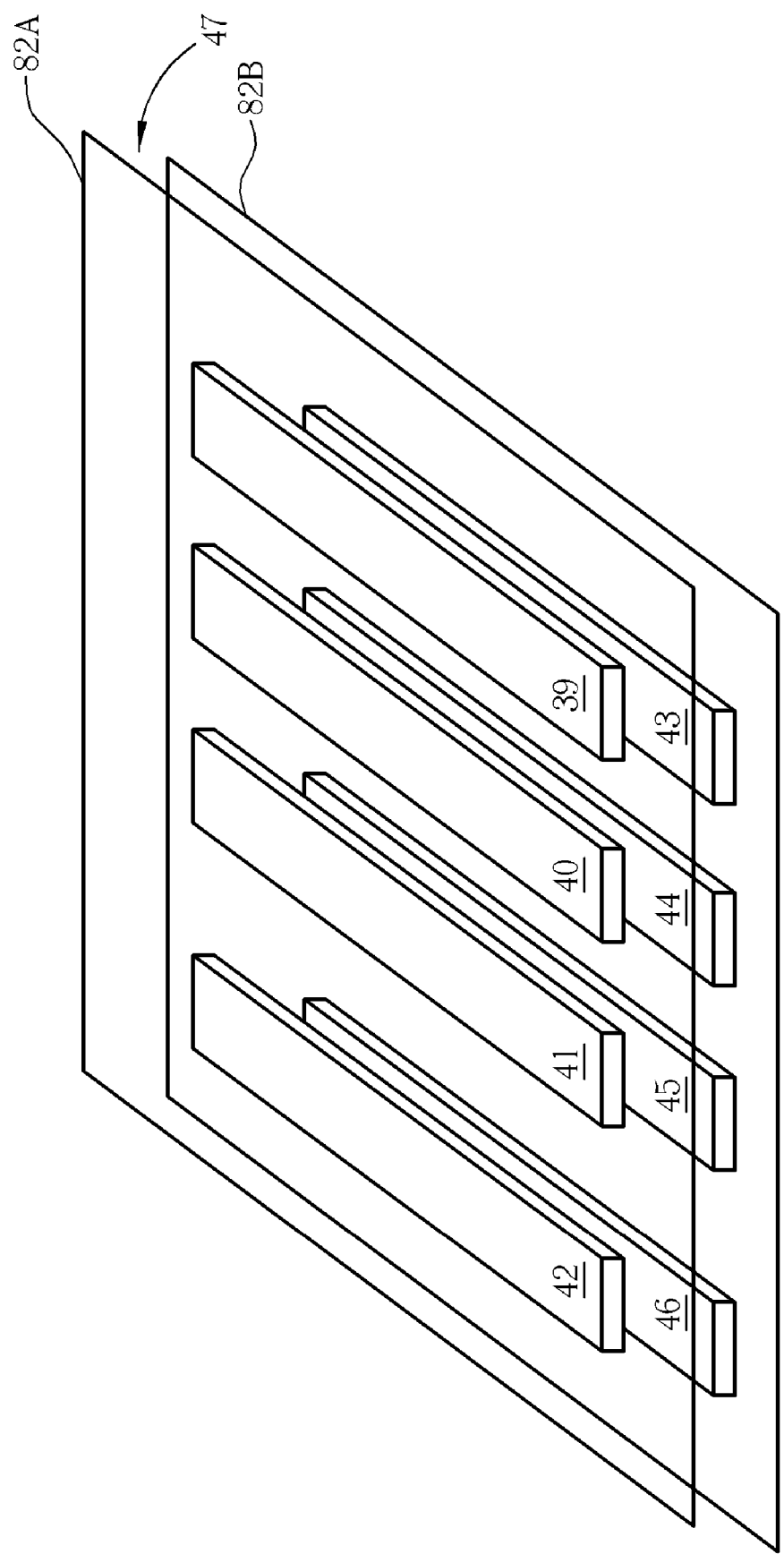
FIG. 6 is a schematic diagram showing a 3-dimensional drawing of a portion of the multi-layer substrate as shown in FIG. 5.

According to the embodiment of arrangement of the plurality of bumper pads 31–38 as shown in FIG. 5, all signal traces 39–46 will be arranged to come out closely from the die periphery 22 for avoiding losing any available space. Under very high routing density, before the signal traces start to fall apart from each other, the space between two adjacent signal traces is very close (the above-mentioned minimum space is only 25 µm). Therefore, the electromagnetic interference between signal traces would become a significant factor to influence the transmitting signal quality. Please refer to FIG. 5. The signal traces 39–46 routed either in the same layer or in different layers are parallel arranged. Thus the interference source for each signal trace will not only come from the adjacent signal traces routed in the same layer, but also come from the adjacent signal traces routed in the different layers. In the same layer, taking the first layer 82A for instance, the signal traces 39–42 would be significantly interfered by the neighboring signal traces due to the close space and no shielding protection. Taking both layers (the first layer 82A and the second layer 82B) into consideration, there is not any shielding trace allowed to be installed for providing signal-quality protection due to the insufficient space. Please refer to FIG. 6, which is a schematic diagram showing a 3-dimensional drawing of a portion of the multi-layer substrate 82 as shown in FIG. 5. The signal traces 39–41 are routed in the first layer 82A of the multi-layer substrate 82, and other three signal traces 43–45 are routed in the second layer 82B of the multi-layer substrate 82. There is another layer 47 representing the dialectical material between the first layer 82A and the second layer 82B. When the signal traces 39, 41, and 44 are switched to operate simultaneously, the signal trace 40 is significantly interfered by the three adjacent signal traces 39, 41, and 44 in both vertical and horizontal directions. The interference effects among the signal traces will be worsen in a build-up substrate 12 as shown in FIG. 2, since the distance between the first layer 82A and the second layer 82B is only 30 µm. Therefore, a whole new arrangement of bumper 1pads and routing pattern should be provided to improve the signal quality on the premise that the corresponding die size can be reduced or at least not significantly increased.

Based on the above-mentioned limitations concerning widths and spaces under current fabrication process, the present invention addresses proper ways related to assigning bumper pads, power/ground bumpers, and the routing of signal trace from the bumper pads in the multi-layer substrate 82. Please refer back to FIG. 5. As in the previous descriptions, only one signal trace is allowed to pass through two adjacent bumper pads with minimum bumper pitch (227 µm). For clarifying the difference between a novel bumper-pad arrangement and the above-mentioned bumper-pad arrangement shown in FIG. 5, a bumper-tile block is introduced and defined. Please refer to FIG. 7, which is a schematic diagram showing both a second arrangement of a plurality of bumper pads 51–58 and the first arrangement of the 8 bumper pads 31–38 shown in FIG. 5. The 8 bumper pads 31–38 can be treated as a first bumper-tile block 84 corresponding to the first arrangement, and another 8 bumper pads 51–58 can be treated as a second bumper-tile block 86 corresponding to the second arrangement. Each bumper-tile block, either the first bumper-tile block 84 or the second bumper-tile block 86, includes 8 bumper pads and is capable of carrying 8 signal traces in the first layer 82A and the second layer 82B of the multi-layer substrate 82 (as the 6-layer build-up substrate 12 shown in FIG. 2). Please notice that the novel second arrangement of the 8 bumper pads 51–58 is just an embodiment of the present invention regarding the arrangement of bumper pads 51–58, and a little modifications toward the second bumper-tile block 86 are included in the characteristics of the present invention. The following descriptions will detail the evolution from the first bumper-tile block 84 to the second bumper-tile block 86.

Figure 7:
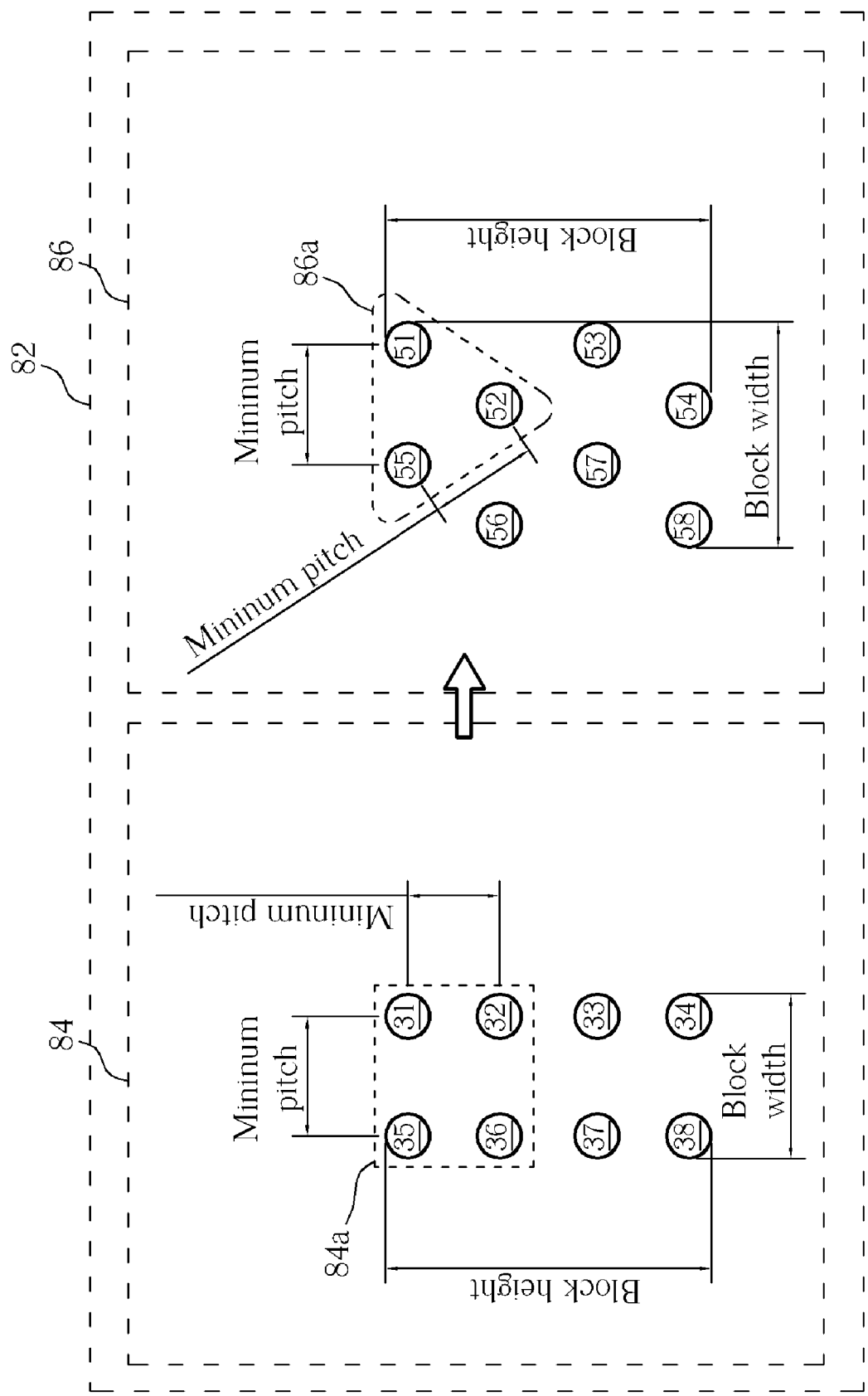
FIG. 7 is a schematic diagram showing both a second arrangement of a plurality of bumper pads and the first arrangement of the 8 bumper pads shown in FIG. 5.

First of all, each bumper-tile block can be treated to be composed of a plurality of units of various shapes. Please refer to FIG. 7. Originally, the first bumper-tile block 84 can be treated to be composed of a plurality of square units 84a, and the related characteristics of the first arrangement have described in the previous embodiment as shown in FIG. 5. According to the present invention, the shape of each unit, which determines the shape of the corresponding bumper-tile block, is changed to be triangle as shown in FIG. 7. Those triangle units 86a are with equal lengths of each side. All the bumper pitches remain the same as those in the first bumper-tile block 84. However, when the shape of each unit changes, the occupation area of the corresponding bumper-tile block, which determines the die size, is also changed. A first block width of the first bumper-tile block 84 is about 342 µm (minimum bumper pitch+pad width: 227+115=342 (µm)), and a first block height is about 796 µm (3×minimum bumper pitch+pad width: 681+115=796(µm)). After the new arrangement, A second block width of the second bumper-tile block 86 is about 455.5 µm (1.5×minimum bumper pitch+pad width: 340.5+115=455.5(µm)), and a second block height is 700 µm ($1.5*\sqrt{3}*$minimum bumper pitch+pad width: 590+115=700(µm)). The above-mentioned easy calculations show that the arrangement of the second bumper-tile block 86 leads to an increase in block width but a cutback in block height comparing to the arrangement of the first bumper-tile block 84. The new arrangement of the second bumper-tile block 86 will not cause much extra die size and will bring the characteristics of the present invention into full play.

Figure 8:
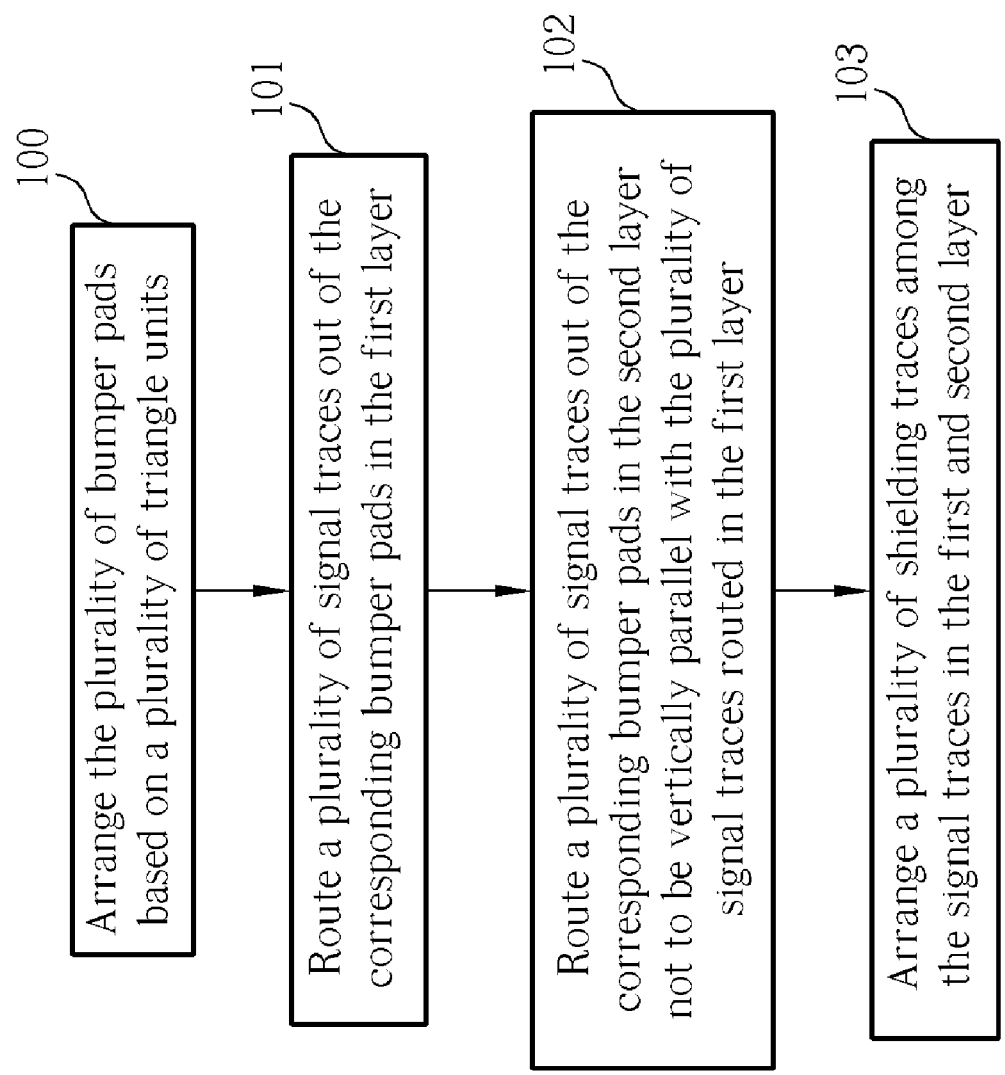
FIG. 8 is a flowchart of an embodiment of the present invention based on the second bumper-tile block shown in FIG. 7.

Based on the arrangement of the second bumper-tile block 86, a routing method for routing a plurality of (8) signal traces out of the corresponding (8) bumper pads of the second bumper-tile block 86 in the multi-layer substrate 82 can be disclosed. As previous mentions, the signal traces are routed in the first layer 82A and the second layer 82B of the multi-layer substrate 82. Please refer to FIG. 8, which is a flowchart of an embodiment of the present invention based on the second bumper-tile block 86 shown in FIG. 7. The operating steps are as follows:

Step 100: arrange the plurality of bumper pads based on a plurality of triangle units;

Step 101: route a plurality of signal traces out of a plurality of corresponding bumper pads in the first layer;

Step 102: route a plurality of signal traces out of a plurality of corresponding bumper pads in the second layer not to be vertically parallel with the plurality of signal traces routed in the first layer;

Step 103: Arrange a plurality of shielding traces among the plurality of signal traces in the first layer and in the second layer.

Figure 9:
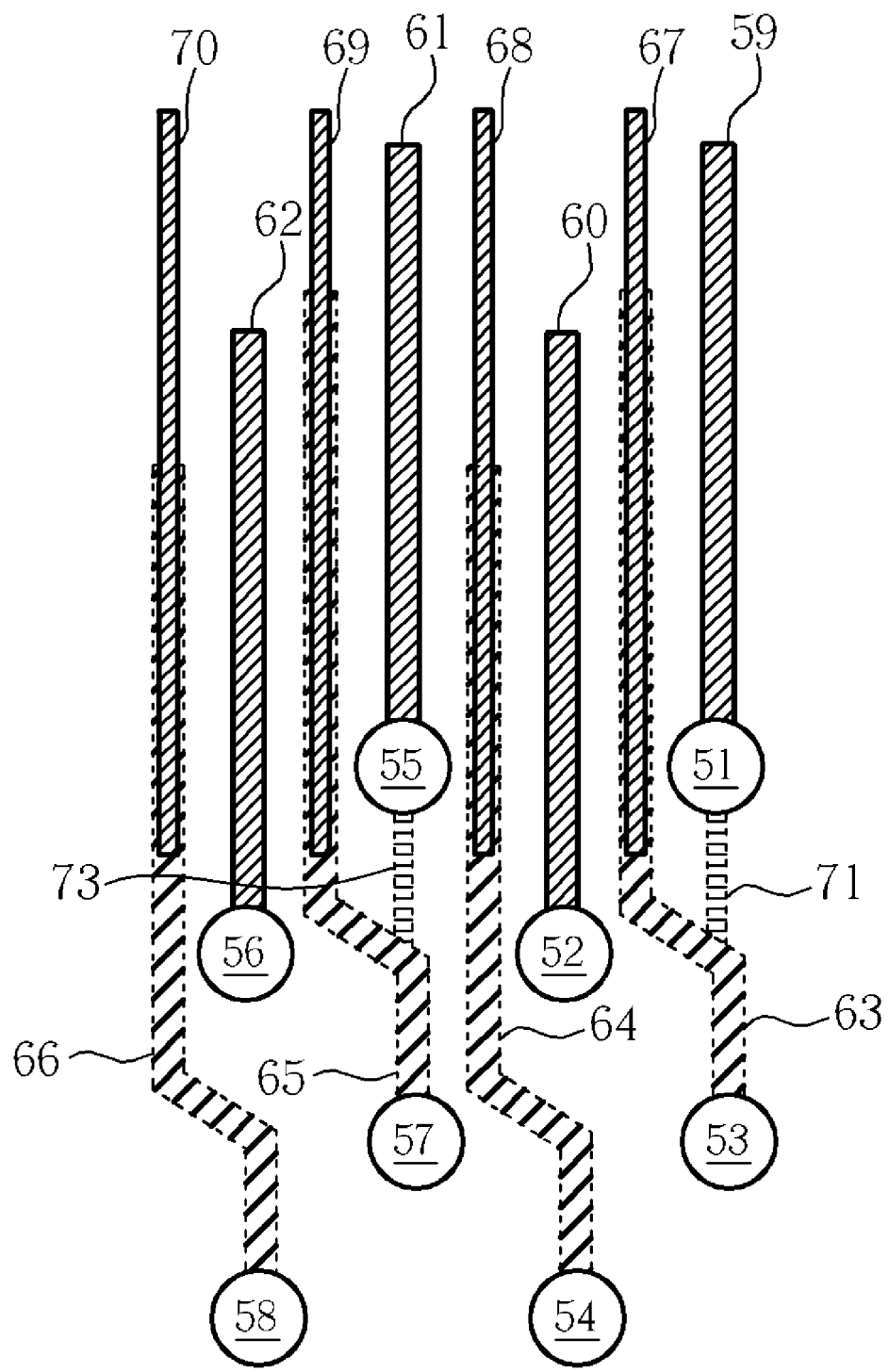
FIG. 9 is a schematic diagram showing the second bumper-tile block shown in FIG. 7 combined with corresponding signal traces and shielding traces.

Please notice that the shape of each unit should not be limited as an equilateral triangle, and various types of triangles are acceptable for designing the shape of each unit according to the invention. In addition, the quantity of bumper pads in the second bumper-tile block 86 should not be limited as 8, and the quantity of bumper pads in the second bumper-tile block 86 can be adjusted according to the practical requirements. Please refer to FIG. 9, which is a schematic diagram showing the second bumper-tile block 86 shown in FIG. 7 combined with corresponding signal traces and shielding traces. As shown in FIG. 9, the bumper pads 51–58 are assigned on the multi-layer substrate 82. A plurality of signal traces 59–62 are respectively routed out of the bumper pads 51, 52, 55 and 56 in the first layer 82A of the multi-layer substrate 82. The other 4 signal traces 63–66 corresponding to the bumper pads 53, 54, 57 and 59 will be assigned to occupy the second layer 82B, and those signal traces in the second layer 82B is filled with slanted lines. Please notice that in the first layer 82A, 4 shielding traces 67–70 (thin lines) are arranged among the 4 signal traces 59–62 for providing shielding functions between the adjacent signal traces in the first layer 82A. Similarly, in the second layer 82B, another 4 shielding traces 71–74 (thin lines filled with slanted lines) are arranged among the 4 signal traces 63–66 for providing shielding functions between the adjacent signal traces in the second layer 82B.

Figure 10:
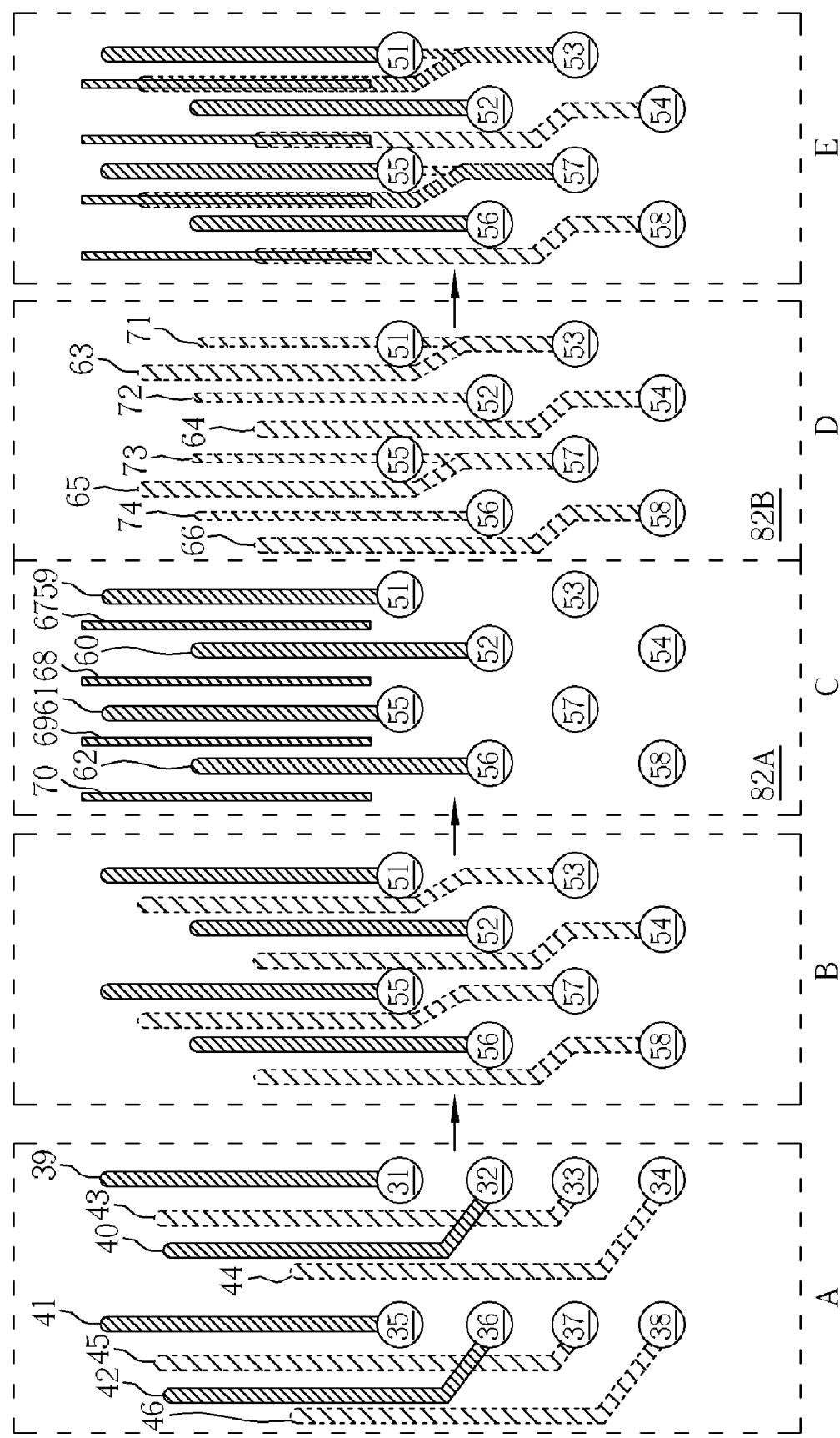
FIG. 10 is a schematic diagram showing evolution from the embodiment shown in FIG. 5 to the embodiment shown in FIG. 9.

The routing method as shown in FIG. 9 can be evolved from the embodiment shown in FIG. 5 step by step. Please refer to FIG. 10, which is a schematic diagram showing evolution from the embodiment shown in FIG. 5 to the embodiment shown in FIG. 9. FIG. 10 includes 5 embodiments A–E, including the embodiment shown in FIG. 5 and the embodiment shown in FIG. 9, and the embodiment E is totally the same as the embodiment shown in FIG. 9. The embodiment A is modified from the embodiment shown in FIG. 5. The signal traces 43–46 in the second layer 82B make turns immediately after depart from bumper pads 33, 34, 37, 38 to prevent being routed parallel with the signal traces 39–42 in the first layer 82A. Afterwards, in the embodiment B, the bumper-tile block is modified to be the same as the second bumper-tile block 86 shown in FIG. 7 and FIG. 9. In the meanwhile, a routing principle is built for routing all the signal traces 18: "the signal traces in the first layer 82A going straight forward, and the signal traces in the second layer 82B turn when starting to fan out". Therefore, all the signal traces will fall apart to avoid from parallel routing in different layers. Until now, only one problem, the vertical interference, is solved. The horizontal interference among signal traces in the same layer requires a more aggressive method, which is adding shielding traces. Please refer to the embodiment C, which shows routing of signal traces in the first (upper) layer, the shielding traces 67–70 are routed between the signal traces 59–62 in the first layer 82A. Similarly, please refer to the embodiment D, which shows routing of signal traces in the second (lower) layer 82B, the shielding traces 71–74 are routed between the signal traces 63–66 in the second layer 82B. After combining the characteristics of the embodiment C and the embodiment D, the desired embodiment E is generated.

Figure 11:
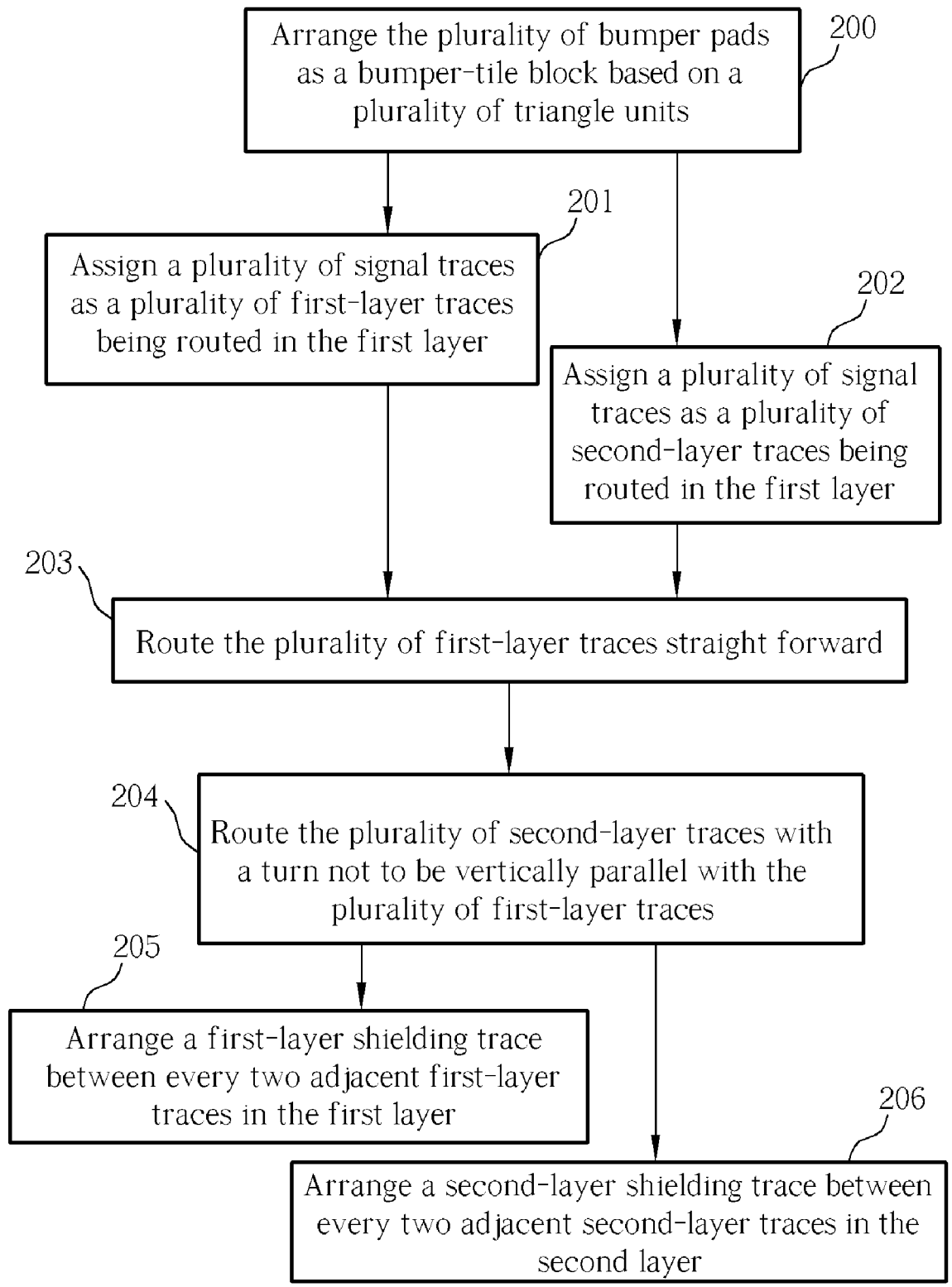
FIG. 11 is a flowchart of another embodiment of the present invention based on the embodiment E shown in FIG. 10.

Based on the embodiment E shown in FIG. 10 and the above-mentioned routing principle, another detailed embodiment of routing method for routing a plurality of (8) signal traces out of the corresponding (8) bumper pads of the second bumper-tile block 86 in the multi-layer substrate 82 can be disclosed. Please refer to FIG. 11, which is a flowchart of another embodiment of the present invention based on the embodiment E shown in FIG. 10. The operating steps are as follows:

Step 200: arrange the plurality of bumper pads as a bumper-tile block by a specific forming process, and the plurality of bumper pads are composed of a plurality of triangle units;

Step 201: assign a plurality of signal traces corresponding to a plurality of bumper pads of the bumper-tile block as a plurality of first-layer traces being routed in the first layer. In the embodiment E shown in FIG. 10, the first-layer traces are signal traces 59–62;

Step 202: assign a plurality of signal traces corresponding to a plurality of bumper pads of the bumper-tile block as a plurality of second-layer traces being routed in the second layer. In the embodiment E shown in FIG. 10, the second-layer traces are signal traces 63–66;

Step 203: route the plurality of first-layer traces straight forward;

Step 204: route the plurality of second-layer traces with a turn not to be vertically parallel with the plurality of first-layer traces;

Step 205: arrange a first-layer shielding trace between every two adjacent first-layer traces in the first layer. In the embodiment E shown in FIG. 10, the first-layer shielding traces are shielding traces 67–70;

Step 206: arrange a second-layer shielding trace between every two adjacent second-layer traces in the second layer. In the embodiment E shown in FIG. 10, the second-layer shielding traces are shielding traces 71–74.

Figure 12:
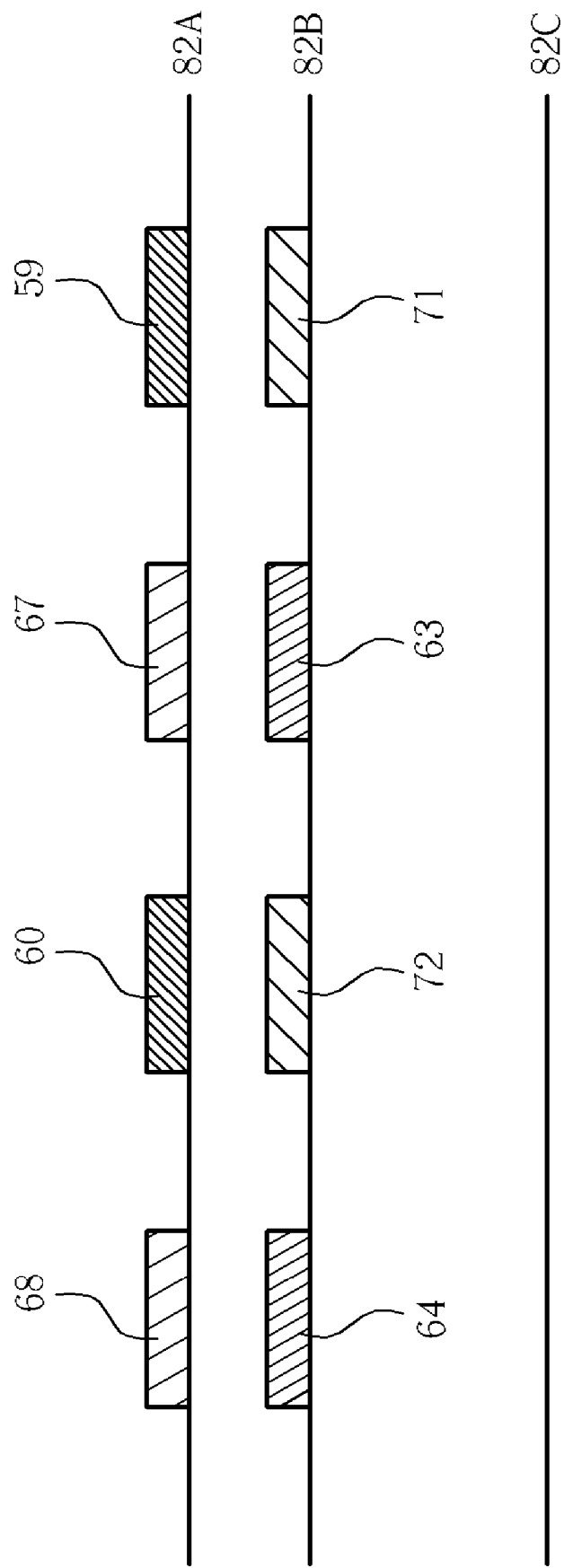
FIG. 12 is a cross-section diagram of the embodiment E shown in FIG. 10.

The derived easy and useful routing principle "the signal traces in the first layer 82A going straight forward, and the signal traces in the second layer 82B turn when starting to fan out" gives an instruction to solve a complicated task of routing the signal traces out of a large amount of bump pads on a die 80 (the die 80 can corresponds to the die 10 shown in FIG. 1). For clearly emphasizing the structure of the present invention, FIG. 12 is introduced for the explanation. FIG. 12 is a cross-section diagram of the embodiment E shown in FIG. 10 as well as the embodiment shown in FIG. 9. Obviously, the multi-layer substrate 82 further comprises a third layer 82C beneath the second layer 82B used as a ground plane. The signal traces 59, 60 are the first-layer traces (defined in FIG. 11) routed in the first layer 82A of the multi-layer substrate 82. The signal traces 63, 64 are the second-layer traces 18(2) routed in the second layer 82B of the multi-layer substrate 82. The signal trace 60 is shielded by two first-layer shielding traces 67, 68 at both side and a second-layer shielding trace 72 underneath. Therefore, each signal trace in the first layer 82A, except a plurality of marginal signal traces (as the signal trace 59), is surrounded by 3 shielding traces, two of which are horizontally parallel with the signal trace and the other is vertically parallel with the signal trace. Similar to the second-layer signal traces, taking the signal trace 63 as example, both sides of it are respectively shielded by two second-layer shielding traces 71, 72. In addition, a first-layer shielding trace 705 lies above it, and the third layer 82C lies beneath it. Therefore, each signal trace in the second layer 82B is surrounded not only by 3 shielding traces but also a ground plane beneath (the third layer 82C). According to the present invention, all of the signal traces can be completely and well protected, and then the capacitive interference would be reduced significantly.

Figure 13:
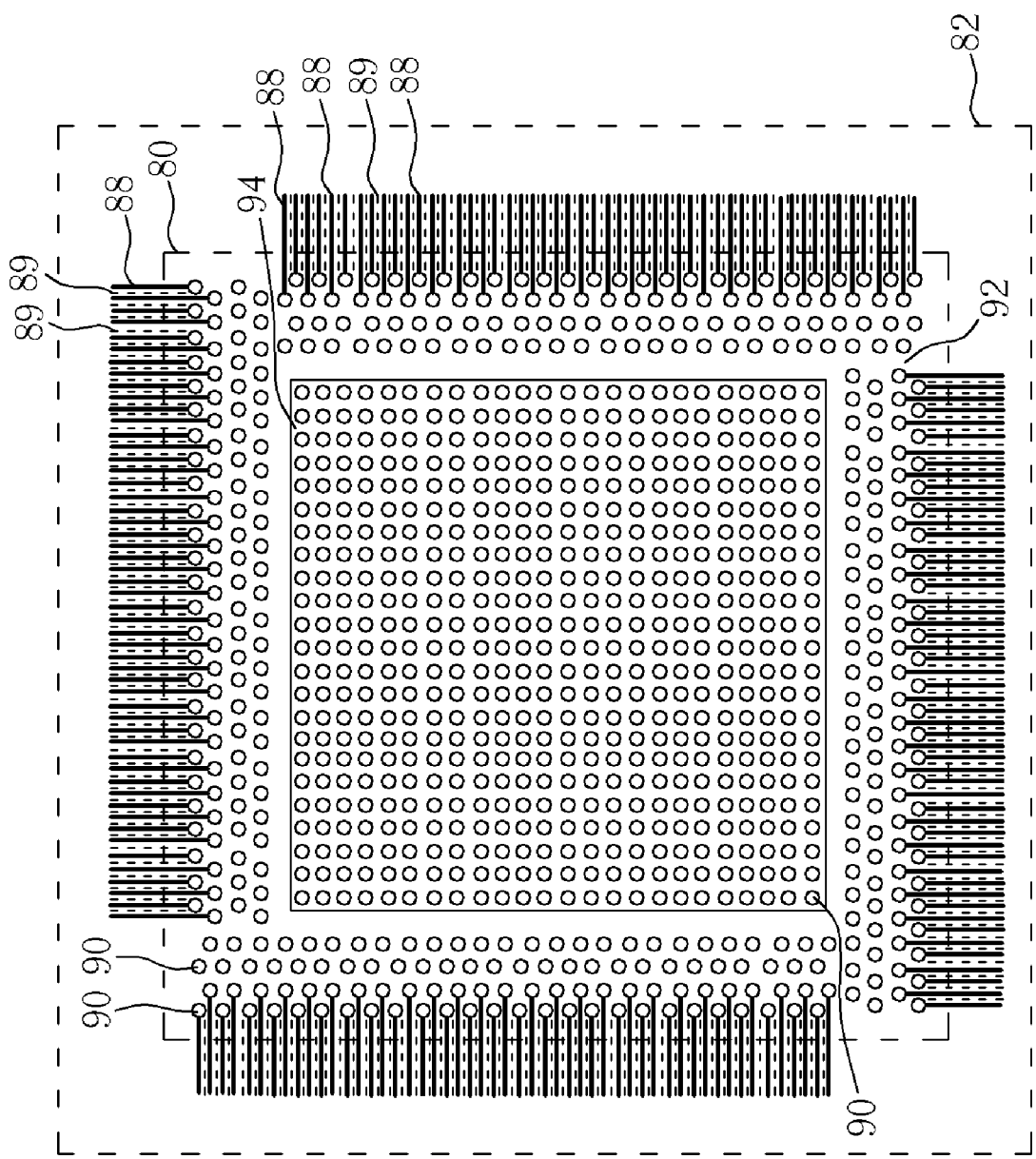
FIG. 13 is a schematic diagram illustrating a plurality of bumper pads with the corresponding routed first-layer tracers arranged over a die according to the present invention.

After all, all the bumper pads related to the signal traces should be combined to form a die periphery 92. Please refer to FIG. 13, which is a schematic diagram illustrating a plurality of bumper pads 90 with the corresponding routed first-layer tracers 88 arranged over a die 80 according to the present invention. The die 80 comprises a center area 94 and a die periphery 92. The embodiment shown in FIG. 13, which is similar with the embodiment as shown in FIG. 4, adapts the characteristics of the above-mentioned embodiments of the present invention. All signal traces (including the first-layer tracers 88) are routed uniformly and interlaced with (ground) shielding traces, and the FIG. 13 only shows first-layer shielding traces 89 drawn in dotted lines. Regarding each side of the die 80 edge, each first-layer tracer 88 goes forward parallel with shielding traces 89 until it reaches its via to be connected to the corresponding soldering ball. Moreover, all signal traces (including the first-layer tracers 88) are routed out of the corresponding bumper pads 90 located on the die periphery 92, and other bumper pads related to power/ground functions are positioned in the center area 24 of the die 80.

In the present invention, a novel routing method, which is applied to a flip chip packaging technique, for routing a plurality of signal traces out of a plurality of corresponding bumper pads in a multi-layer substrate is proposed. The bumper pads are grouped into a plurality of bumper-tile blocks and arranged based on a plurality of triangle units. When being implemented, the plurality of signal traces are only routed in the first layer and the second layer of the multi-layer substrate. The third layer of multi-layer substrate is used for power and ground connections. In addition, a plurality of shielding traces are arranged among the plurality of signal traces in the first layer and in the second layer for providing shielding functions without the requirement of extra space occupation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for routing a plurality of signal traces out of a plurality of corresponding bumper pads for implementation of a die on a multi-layer circuit board, the method comprising:
   utilizing the plurality of bumper pads positioned in a periphery area of the die;
   utilizing a plurality of power/ground bumper pads positioned in a center area of the die;
      assigning a plurality of signal traces corresponding to a plurality of bumper pads as a plurality of first-layer traces being routed in a first layer of the multi-layer circuit board;
   assigning a plurality of signal traces corresponding to a plurality of bumper pads as a plurality of second-layer traces being routed in a second layer of the multi-layer circuit board wherein the second layer is vertically beneath the first layer;
   routing the plurality of first-layer traces straight away from the die;
   routing the plurality of second-layer traces with a turn; and
   shielding the plurality of first-layer traces and the plurality of second-layer traces by routing a plurality of shielding traces out of the plurality of power/ground bumper pads;
   wherein the plurality of bumper pads can be grouped into a plurality of bumper-tile blocks and each bumper-tile block comprises 8 bumper pads organized in a plurality of triangle units with equal length of each side.

2. The method of claim 1, wherein the plurality of signal traces are capable of carrying a plurality of input/output signals for communicating the die with a plurality of exterior devices installed on the multi-layer circuit board.

3. The method of claim 1, wherein the plurality of shielding traces comprise a plurality of first-layer shielding traces routed in the first layer and a plurality of second-layer shielding traces routed in the second layer.

4. The method of claim 3 further comprising:
   arranging each first-layer shielding trace between every two adjacent first-layer traces in the first layer of the multi-layer circuit board; and
   arranging each second-layer shielding trace between every two adjacent second-layer traces in the second layer of the multi-layer circuit board.

5. The method of claim 4, wherein the multi-layer circuit board further comprises a third layer used as a power/ground plane, the method further comprising:
   utilizing each first-layer shielding trace connected to the third layer for grounding; and
   utilizing each second-layer shielding trace connected to the third layer for grounding.

6. The method of claim 1, wherein the multi-layer circuit board is a 6-layer build-up substrate or any other multi-layer board for high pin-count application.

7. The method of claim 1 being applied to a flip chip packaging technique and other packaging techniques.

8. The method of claim 1 further comprising arranging the plurality of bumper pads in a specific forming process.

9. A method for routing a plurality of signal traces out of a plurality of corresponding bumper pads for implementation of a die on a multi-layer circuit board, the method comprising:
   utilizing the plurality of bumper pads positioned in a periphery area of the die;
   utilizing a plurality of power/ground bumper pads positioned in a center area of the die;
   assigning a plurality of signal traces corresponding to a plurality of bumper pads as a plurality of first-layer traces being routed in a first layer of the multi-layer circuit board;
   assigning a plurality of signal traces corresponding to a plurality of bumper pads as a plurality of second-layer traces being routed in a second layer of the multi-layer circuit board wherein the second layer is vertically beneath the first layer;
   routing the plurality of first-layer traces straight away from the die;
   routing the plurality of second-layer traces with a turn;
   shielding the plurality of first-layer traces and the plurality of second-layer traces by routing a plurality of shielding traces out of the plurality of power/ground bumper pads, the plurality of shielding traces comprising a plurality of first-layer shielding traces routed in the first layer and a plurality of second-layer shielding traces routed in the second layer;
   arranging each first-layer shielding trace between every two adjacent first-layer traces in the first layer of the multi-layer circuit board; and
   arranging each second-layer shielding trace between every two adjacent second-layer traces in the second layer of the multi-layer circuit board.

10. The method of claim 9, wherein the plurality of signal traces are capable of carrying a plurality of input/output signals for communicating the die with a plurality of exterior devices installed on the multi-layer circuit board.

11. The method of claim 9, wherein the plurality of bumper pads can be grouped into a plurality of bumper-tile blocks.

12. The method of claim 11, wherein each bumper-tile block comprises 8 bumper pads organized in a plurality of triangle units with equal length of each side.

13. The method of claim 9, wherein the multi-layer circuit board further comprises a third layer used as a power/ground plane, the method further comprising:
utilizing each first-layer shielding trace connected to the third layer for grounding; and
utilizing each second-layer shielding trace connected to the third layer for grounding.

14. The method of claim 9, wherein the multi-layer circuit board is a 6-layer build-up substrate or any other multi-layer board for high pin-count 20 application.

15. The method of claim 9 being applied to a flip chip packaging technique and other packaging techniques.

16. The method of claim 9 further comprising arranging the plurality of bumper pads in a specific forming process.

* * * * *